US009704757B1

(12) United States Patent
     Caimi et al.

(10) Patent No.: US 9,704,757 B1
(45) Date of Patent: Jul. 11, 2017

(54) FABRICATION OF SEMICONDUCTOR STRUCTURES

(71) Applicant: International Business Machines Corporation, Armonk, NY (US)

(72) Inventors: Daniele Caimi, Besenbueren (CH); Lukas Czornomaz, Zurich (CH); Veeresh Deshpande, Zurich (CH); Vladimir Djara, Kilchberg (CH); Jean Fompeyrine, Waedenswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/053,164

(22) Filed: Feb. 25, 2016

(51) Int. Cl.
| | |
|---|---|
| *H01L 21/02* | (2006.01) |
| *H01L 21/8238* | (2006.01) |
| *H01L 29/06* | (2006.01) |
| *H01L 29/786* | (2006.01) |
| *H01L 29/66* | (2006.01) |
| *H01L 21/84* | (2006.01) |
| *H01L 27/12* | (2006.01) |
| *H01L 27/092* | (2006.01) |

(52) U.S. Cl.
CPC ...... *H01L 21/823807* (2013.01); *H01L 21/84* (2013.01); *H01L 27/092* (2013.01); *H01L 27/1207* (2013.01); *H01L 29/0673* (2013.01); *H01L 29/66742* (2013.01); *H01L 29/78681* (2013.01); *H01L 29/78684* (2013.01); *H01L 29/78696* (2013.01)

(58) Field of Classification Search
CPC ......... H01L 21/76898; H01L 29/78696; B81B 2201/0264; B81B 2203/0118
USPC ............................................. 257/416; 438/51
See application file for complete search history.

(56) References Cited

U.S. PATENT DOCUMENTS

| | | | |
|---|---|---|---|
| 6,411,754 B1 * | 6/2002 | Akkaraju | G02B 6/3584 385/15 |
| 8,173,551 B2 | 5/2012 | Bai et al. | |
| 8,384,196 B2 | 2/2013 | Cheng et al. | |
| 2008/0308920 A1 * | 12/2008 | Wan | B81C 1/00095 257/685 |

* cited by examiner

*Primary Examiner* — David Vu
*Assistant Examiner* — Jonathan Han
(74) *Attorney, Agent, or Firm* — Scully, Scott, Murphy & Presser, P.C.; Daniel P. Morris, Esq.

(57) ABSTRACT

The invention relates to a method for fabricating a semiconductor circuit comprising providing a semiconductor substrate; fabricating a first semiconductor device comprising a first semiconductor material on the substrate and forming an insulating layer comprising a cavity structure on the first semiconductor device. The cavity structure comprises at least one growth channel and the growth channel connects a crystalline seed surface of the first semiconductor device with an opening. Further steps include growing via the opening from the seed surface a semiconductor filling structure comprising a second semiconductor material different from the first semiconductor material in the growth channel; forming a semiconductor starting structure for a second semiconductor device from the filling structure; and fabricating a second semiconductor device comprising the starting structure. The invention is notably also directed to corresponding semiconductor circuits.

21 Claims, 15 Drawing Sheets

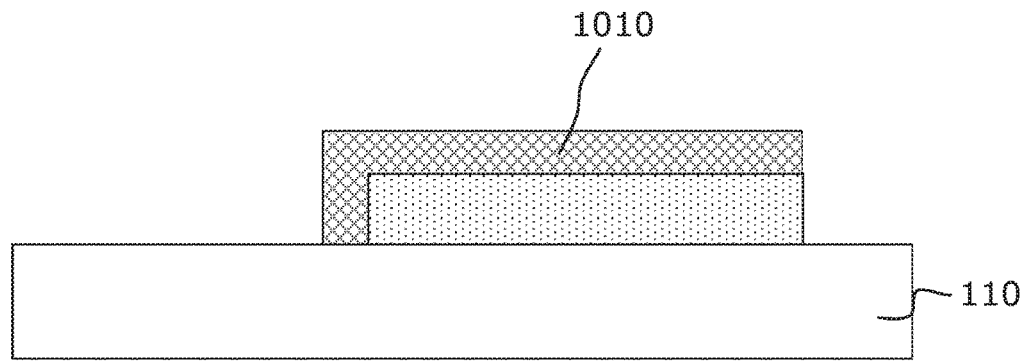
FIG. 11     1100
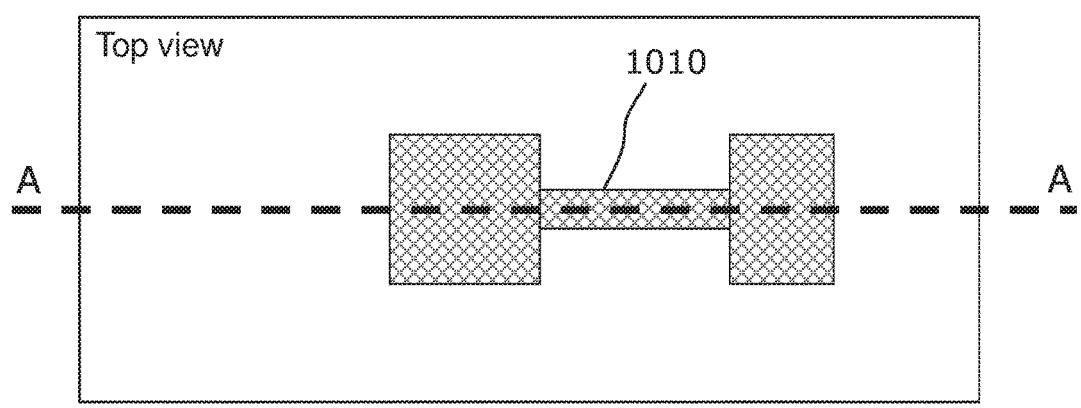
FIG. 12     1200

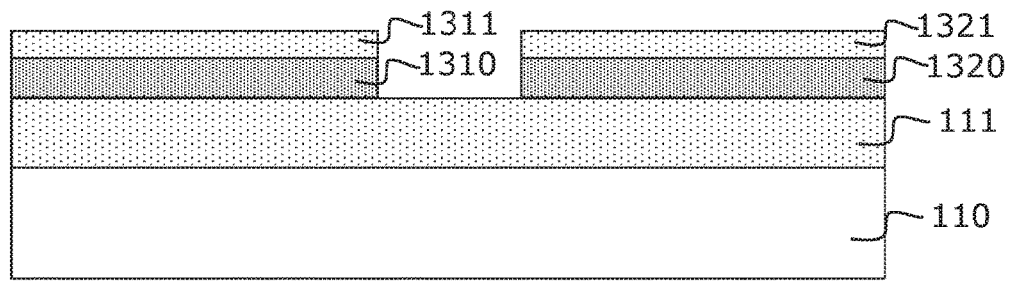
FIG. 13    1300
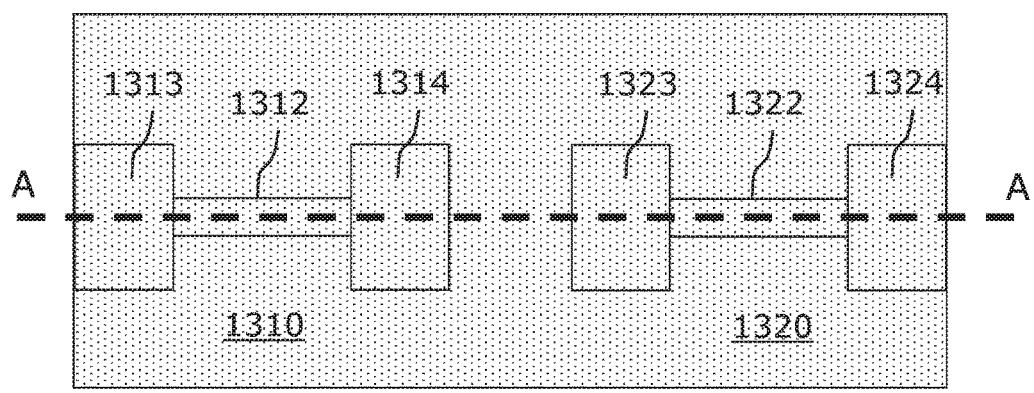
FIG. 14    1400

2300

2400

FABRICATION OF SEMICONDUCTOR STRUCTURES

BACKGROUND

Embodiments of the invention relate generally to the fabrication of semiconductor structures and more particularly to the fabrication of compound semiconductor nanostructures and microstructures on substrates having an insulating layer.

Silicon is the basic material for present solid-state electronics, and processing techniques have been evolved for decades. Hence, most electronic integrated circuit devices are based on silicon.

However, III-V compound semiconductors, and especially InGaAs, are being considered as a potential alternative for replacing strained Si in the channel of future nFETs due to their remarkable electron mobility. Moreover, some III-V compound semiconductors present several advantages for opto-electronics applications when compared to Si.

A monolithic integration of compound semiconductors on silicon wafers is desirable and has extensively been investigated in the past. Several problems need to be overcome when compound semiconductors and conventional silicon technologies are be combined. First, there is a large lattice mismatch between a crystalline silicon substrate and compound semiconductor crystals. Further, there is a thermal expansion coefficient mismatch between the (silicon) wafer material and the active compound semiconductor material. Additionally, a structural mismatch between diamond-like structures and zincblende structures may occur. It is an overall goal to achieve high crystalline quality over various monolithic layers for compound semiconductor on a foreign substrate such as silicon.

In an effort to achieve high crystalline quality in crystalline material layers that show a lattice mismatch, several methods have been developed. For example, direct epitaxy of blanket layers allow for a gradual transition from one lattice parameter to the next. However, relatively thick transition layers are needed to reduce the defect density considerably.

Techniques to combine compound semiconductor materials with conventional silicon wafers include bonding techniques. In direct wafer bonding, a compound hetero structure is fabricated on a donor wafer wherein the donor wafer material is eliminated after bonding with the conventional silicon wafer. This makes the bonding technology relatively expensive. Further, bonding is limited to the size of costly compound substrate wafers.

Another approach for combining lattice-mismatched materials such as compound semiconductors with silicon substrates is the aspect ratio trapping approach. Aspect ratio trapping (ART) refers to a technique where crystalline defects are terminated at non-crystalline, for example dielectric, sidewalls. U.S. Pat. No. 8,173,551 B2 discloses a method where a silicon substrate is covered with a dielectric layer defining trenches through to the substrate material. In the trenches, epitaxial films of a compound material are deposited wherein particular geometries of the growth front are realized. The aspect ratio of the trenches needs to be high enough to terminate the defects that nucleate at the silicon-compound interface so that higher parts of the crystalline compound show a low crystalline defect density. Some approaches of the ART technique include the use of Germanium microcrystals grown in silicon oxide trenches on a silicon substrate with a gallium arsenide film on top.

Another ART approach is disclosed in U.S. Pat. No. 8,384,196 B2 employing an additional epitaxial layer overgrowth (ELO) of the trenches. Relatively thick compound semiconductor or germanium layers are obtained on the trench-forming dielectric, and the crystalline compound or germanium is preferably planarized prior to further processing.

It is therefore desirable to provide improved fabrication methods for semiconductor structures, in particular for compound semiconductor nanostructures and microstructures on substrates having an insulating layer.

SUMMARY

According to a first aspect, the invention is embodied as a method for fabricating a semiconductor structure. According to the embodied method a sacrificial structure comprising a sacrificial material is provided on an insulating layer of a semiconductor substrate. The method comprises forming a spacer of a spacer material connecting the sacrificial structure with the substrate; forming a cavity layer on the sacrificial structure, the spacer and the insulating layer and forming an opening in the cavity layer. Thereby a surface of the sacrificial structure is exposed. Further steps comprise selectively removing the sacrificial material, thereby forming a first cavity; selectively removing the spacer, thereby forming a second cavity connecting the first cavity to a seed surface of the substrate and growing from the seed surface via the second cavity a replacement structure comprising a semiconductor material in the first cavity. Thereby the sacrificial material is replaced with the semiconductor material.

Methods according to embodiments of the first aspect may facilitate an efficient and precise fabrication of semiconductor structures. The sacrificial structures may be prefabricated structures that have been prefabricated in in a technology that is particularly suitable for the sacrificial material. Accordingly fabrication processes to fabricate the sacrificial structure may be adapted and optimized for the sacrificial material, e.g. in terms of thermal budget, lithography and etching methods and generally any other fabrication techniques suitable for the fabrication of structures of the sacrificial material. According to methods of embodiments of the invention the prefabricated sacrificial structures of the sacrificial material can be replaced with replacement structures of a semiconductor material having the same shape/form as the sacrificial structures. In other words, according to embodiments of the invention the prefabricated sacrificial structure can be used as a template for forming a replacement structure of a different material having the same form/shape as the sacrificial structure as well as the same position on the substrate as the sacrificial structure. The seed surface may preferably be embodied as crystalline seed surface.

According to a preferred embodiment the sacrificial material comprises one of: $Si_xGe_{1-x}$ where $x=0$ to 1; poly-Silicon and amorphous Silicon. This allows to use a plurality of well-known and established fabrication processes and methods.

According to another preferred embodiment the semiconductor material of the replacement structure is comprised of one of: a group III-V compound material and a group II-VI compound material. This allows to integrate such compound materials in an efficient and precise way on the substrate, e.g. a Si-Substrate. Such III-V and II-VI compound materials may be used in particular to fabricate e.g. analog/RF Field Effect Transistors (FETs) or Fin/planar FETs for CMOS applications or photonic devices such as lasers or detectors.

According to a preferred embodiment the step of forming the spacer comprises exposing the seed surface of the substrate by selectively etching the insulating layer, forming a spacer layer by conformal deposition of the spacer material and forming the spacer at sidewalls of the insulating layer and the sacrificial layer by selectively etching the spacer layer.

The steps according to this embodiment may be performed by well-known and well controllable techniques suitable for high volume manufacturing. The selective etching may be performed by any suitable lithography and subsequent etching techniques. Suitable lithography techniques include photolithography and electron beam lithography. Etching may be embodied as Reactive Ion Etching (RIE) or etching in high density etchers featuring Inductively Coupled Plasma (ICP) or Electron Cyclotron Resonance (ECR) or Helicon sources. The conformal deposition may be performed e.g. by Plasma Enhanced Chemical Vapor Deposition (PECVD) or by Plasma Enhanced Atomic Layer Deposition (PEALD).

According to another preferred embodiment the step of forming the spacer comprises patterning the insulating layer in vertical alignment to an outer edge of the sacrificial structure, thereby exposing the seed surface of the substrate; forming the spacer layer by conformal deposition of the spacer material on the exposed seed surface of the substrate and on exposed surfaces of the sacrificial layer and the insulating layer.

According to this embodiment the spacer is aligned to an outer edge of the sacrificial structure. This allows the complete removal of the sacrificial structure and formation of the replacement structure in an efficient and reliable way.

According to a further embodiment the method comprises forming an opening through the sacrificial layer and the insulating layer to the substrate, thereby exposing the seed surface of the substrate and forming the spacer layer by conformal deposition of the spacer material on the exposed seed surface of the substrate and on exposed surfaces of the sacrificial layer and the insulating layer.

According to this embodiment the spacer may be formed in an opening within the sacrificial structure. This may be particularly efficient in terms of area and space usage for some specific applications.

According to a further embodiment a semiconductor device is formed on the replacement structure and the replacement structure is an active layer of the semiconductor device.

Such an active layer may also be denoted as functional layer as it is involved in the functional behavior of the semiconductor device. In this respect an active layer is opposed to passive components/layers of the semiconductor device such as a substrate, substrate layer or bulk substrate which provide only mechanical/fabrication support, but are not actively involved in the function of the semiconductor device.

According to a further preferred embodiment the semiconductor device may be a Field Effect Transistors (FET) and the replacement structure comprises a channel structure of the FET. In this embodiment the channel structure is an active layer of the FET.

According to a further embodiment a semiconductor device is formed on the replacement structure and the replacement structure is a virtual substrate of the semiconductor device.

A virtual substrate may be defined as a substrate that serves as support/foundation/starting point for the subsequent formation of the semiconductor device as opposed to the substrate as such which is a main/base substrate that may support a plurality of semiconductor devices or semiconductor structures arranged on the substrate.

According to an embodiment the spacer layer comprises $SiN_x$ or derivatives thereof. This is advantageous as the deposition of $SiN_x$ may be very well controlled. Furthermore, also the etching, in particular the dry-etching of $SiN_x$, may be very well and precisely controlled, in particular by Inductively Coupled Plasma (ICP) etching, Reactive Ion Etching (RIE), Electron Cyclotron Resonance (ECR) etching, and Helicon etching. This may allow to etch the spacer layer very precisely and form thereby the spacer very accurately.

According to a further embodiment the area of the seed surface of the substrate is defined by the cross section area of the spacer at the surface of the substrate. In other words, by forming the spacer in a precise and accurate way, the seed surface of the substrate can be fabricated in a precise and accurate way.

According to an embodiment the seed surface of the substrate has a seed surface area of less than 2500 $nm^2$. The use of a small area enables seeding from a single point in order to achieve low defect density in the regrown semiconductor material of replacement structure. According to a preferred embodiment the seed surface of the substrate has a length set by the spacer thickness that is preferably smaller than 50 nm and a width that is preferably smaller than 50 nm.

According to a further preferred embodiment the growing of the replacement structure is performed by metal organic chemical vapor deposition (MOCVD); atmospheric pressure CVD; low or reduced pressure CVD; ultra-high vacuum CVD; molecular beam epitaxy (MBE); atomic layer deposition (ALD) or hydride vapor phase epitaxy. Such methods are well established and allow a precise and reliable control of the growth of the replacement structure.

According to a further preferred embodiment the spacer layer is formed as bilayer comprising a first spacer sublayer and a second spacer sublayer. Such a bilayer may provide additional fabrication options to fabricate the spacer. The first spacer sublayer and the second spacer sublayer are preferably formed of different spacer materials. According to one preferred embodiment the first spacer sublayer is formed as a high dielectric constant material (high-K material) layer. The first spacer sublayer may comprise $Al_2O_3$ according to embodiments and the second spacer sublayer may comprise according to preferred embodiments amorphous silicon or polysilicon.

The second spacer sublayer may be suited in particular to facilitate the step of forming the spacer at sidewalls of the insulating layer and the sacrificial structure. This allows to use very thin first spacer sublayers, e.g. sublayers that are only a few nm thick. Etching of such thin layers at sidewalls may be difficult to control. In such cases the second spacer sublayer increases the total spacer thickness and may work as a vertical etch stop during the formation/etching of the first spacer sublayer. Furthermore, the increased total spacer thickness provides an enlarged connection between the substrate and the cavity structure which may facilitate the growth of the replacement structure.

According to a preferred embodiment the method comprises forming the first spacer sublayer, forming the second spacer sublayer, selectively etching a first part of the first spacer sublayer, selectively etching the second spacer sublayer and selectively etching a second part of the first spacer sublayer. Such a three step etching approach can be well controlled and allows selective etching of the different materials of the first spacer sublayer and the second spacer sublayer.

According to another preferred embodiment the method comprises providing a first semiconductor structure comprising a first semiconductor material on the insulating layer and providing the sacrificial structure comprising the first semiconductor material as sacrificial material on the insulating layer. Further steps include forming a first spacer of the spacer material connecting the first semiconductor structure with the substrate; forming a second spacer of the spacer material connecting the sacrificial structure with the substrate;

forming a first semiconductor device on the first semiconductor structure; forming a cavity layer on the first semiconductor device, the first and the second spacer and the sacrificial structure; forming an opening in the cavity layer of the sacrificial structure, thereby exposing a surface of the sacrificial structure; selectively removing the first semiconductor material of the sacrificial structure, thereby forming the first cavity; selectively removing the second spacer, thereby forming the second cavity connecting the first cavity to the seed surface of the substrate; growing from the seed surface via the second cavity a second semiconductor structure as replacement structure comprising a second semiconductor material different from the first semiconductor material in the first cavity structure, thereby replacing the first semiconductor material with the second semiconductor material and forming a second semiconductor device on the second semiconductor structure.

Methods according to the latter embodiment may facilitate an efficient and precise fabrication of hybrid semiconductor circuits. The semiconductor circuits may comprise semiconductor devices having different semiconductor materials. According to embodiments the first semiconductor device is fabricated with the first semiconductor material and in parallel and simultaneously respectively the sacrificial structure is formed also with the first semiconductor material. Accordingly the sacrificial structure serves as placeholder for a subsequently formed second semiconductor structure of the second semiconductor material.

In this respect embodiments of the invention allow aligning the second semiconductor device to the first semiconductor device. Furthermore, fabrication processes may be adapted and optimized respectively for the different semiconductor materials, e.g. in terms of thermal budget. As an example, the first semiconductor device may be a p-FET comprising $Si_xGe_{1-x}$ (with x=0 to 1) and the second semiconductor device may be a n-FET comprising a group III-V compound material. With methods according to embodiments of the invention the group III-V material of the nFET is not exposed to the high thermal budget of the p-FET.

Embodiments of the invention may facilitate co-integration of hybrid circuits, e.g. $Si_xGe_{1-x}$ semiconductor devices with group III-V compound semiconductor devices. This is a promising approach for the co-integration of compound semiconductors for sub-10-nm technology nodes. According to one embodiment the first semiconductor device may be embodied as digital device and the second semiconductor device may be embodied as analog/RF device.

According to a further aspect of the invention a semiconductor structure is provided which comprises a semiconductor substrate, an insulating layer on the semiconductor substrate and a replacement structure on the insulating layer comprising a semiconductor material. The replacement structure is epitaxially grown in a first cavity from a seed surface of the substrate via a second cavity. The second cavity is spacer cavity formed from a spacer connecting the first cavity with the substrate. The area of the seed surface of the substrate is defined by the cross section area of the spacer at the surface of the substrate.

According to a further aspect of the invention a hybrid semiconductor circuit is provided. The hybrid semiconductor circuit comprises a substrate, an insulating layer on the substrate, a first Field Effect Transistor (FET) having a channel structure comprising $Si_xGe_{1-x}$ where x=0 to x=1 and a second Field Effect Transistor (FET) having a channel structure comprising a group III-V semiconductor material. The channel structure of the second FET is epitaxially grown in a first cavity from a seed surface of the substrate via a second cavity. The second cavity is a spacer cavity formed from a spacer connecting the first cavity with the substrate. The area of the seed surface of the substrate is defined by the cross section area of the second cavity at the surface of the substrate. The channel structure of the first FET and the channel structure of the second FET have the same thickness.

According to another aspect the invention is embodied as a semiconductor circuit obtainable by methods according to embodiments of the first aspect.

A further aspect of the invention concerns a wafer comprising a plurality of semiconductor circuits as claimed in the previous aspect.

The steps of the different aspects of the invention may be performed in different orders. Furthermore, the steps may also be combined, i.e. that e.g. two or more steps may be performed together.

Advantages of the features of one aspect of the invention may apply to corresponding features of another aspect of the invention.

Embodiments of the invention will be described in more detail below, by way of illustrative and non-limiting examples, with reference to the accompanying drawings.

BRIEF DESCRIPTION OF THE SEVERAL VIEWS OF THE DRAWINGS

FIG. 11 shows a cross-sectional view of the structure of FIG. 10 after removal of the cavity layer;

FIG. 12 shows a top view of the structure of FIG. 11;

FIG. 13 illustrates a cross sectional view of another initial structure;

FIG. 14 shows a corresponding top view on the structure of FIG. 13;

DETAILED DESCRIPTION

FIGS. 1-12 show successive stages of a method for fabricating a semiconductor structure.

FIGS. 1-12 and the other Figures subsequently described below generally show enlarged cross-sectional views or top views of initial, intermediate and final structures formed during the stages of the method. In any or all of the figures the dimensions may not be drawn to scale and may be shown in a simplified and schematic way to illustrate the features and principles of embodiments of the invention.

Figure 1:
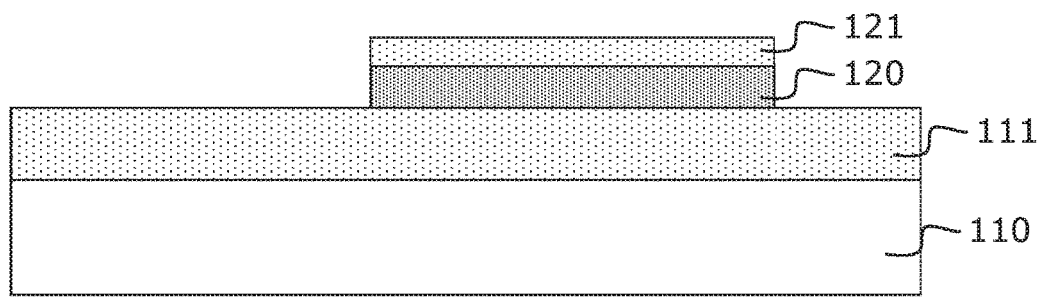
FIG. 1 illustrates a cross-sectional view of an initial structure with a hard mask.

FIG. 1 illustrates a cross-sectional view of an initial structure 100. The initial structure 100 comprises a substrate 110. The substrate 110 may be e.g. a bulk semiconductor substrate, a substrate comprising an insulating layer such as a silicon on insulator (SOI) substrate or a hybrid substrate. The substrate 110 may be embodied as a crystalline silicon or crystalline compound semiconductor wafer of any diameter. The substrate may comprise, for example, a material from group IV of the periodic table. Materials of group IV include, for example, silicon, germanium, mixed silicon and germanium, mixed silicon and carbon, mixed silicon germanium and carbon and the like. For example, the substrate 110 may be a crystalline silicon wafer that is used in the semiconductor industry.

On the substrate 110 an insulating layer 111 is provided. The insulating layer 111 may be embodied e.g. as a dielectric layer. According to embodiments the insulating layer 111 may be a buried oxide (BOX) layer. The insulating layer 111 can be formed by known methods, as for example thermal oxidation, chemical vapor deposition (CVD), plasma enhanced CVD (PECVD), atomic layer deposition, chemical solution deposition, MOCVD, evaporation, sputtering and other deposition processes. Examples of such dielectric material include, but are not limited to: $SiO_2$, $Si_3N_4$, $Al_2O_3$, AlON, $Ta_2O_5$, $TiO_2$, $La_2O_3$, $SrTiO_3$, $LaAlO_3$, $ZrO_2$, $Y_2O_3$, $Gd_2O_3$, MgO, MgNO, Hf-based materials and combinations including multilayers thereof.

The thicknesses of the substrate 110 and the insulating layer 111 can be any suitable thicknesses.

On the insulating layer 111 a sacrificial structure 120 has been formed. The sacrificial structure comprises a sacrificial material. The sacrificial structure 120 establishes a negative mold for a cavity to be formed subsequently. According to some embodiments the sacrificial structure 120 may comprise amorphous silicon as sacrificial material. According to other embodiments one may also use polymers or other suitable materials that can be removed easily in a subsequent step. According to another preferred embodiment the sacrificial material may comprise $Si_xGe_{1-x}$ where x=0 to 1, poly-Silicon or amorphous silicon. This allows the use of a plurality of well-known and established fabrication processes and methods to form the sacrificial structure 120. The sacrificial structure 120 may be prefabricated in a technology that is particularly suitable for the respective sacrificial material and may have any desired form and shape. Fabrication processes such as lithography and etching processes may be adapted and optimized for the respective sacrificial material. On top of the sacrificial structure 120 a protection layer 121 is arranged. The protection layer 121 may be embodied as oxide layer, e.g. as a layer of $SiO_2$. The protection layer 121 may have been formed by suitable deposition techniques as known in the art. The protection layer protects the underlying sacrificial structure 120 during subsequent etching processes and facilitates a subsequent formation of a spacer as will be described below in more detail.

Figure 2:
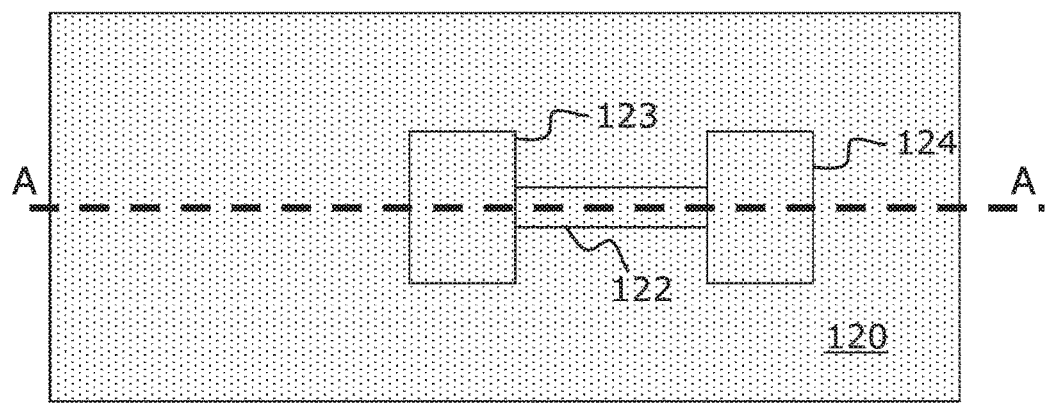
FIG. 2 shows a corresponding top view on the structure of FIG. 1.

FIG. 2 shows as structure 200 a corresponding top view on the structure 100 of FIG. 1. More particularly, FIG. 1 is a cross section A-A of the top view of FIG. 2. As illustrated in FIG. 2, the sacrificial structure 120 is embodied as base structure for a Field Effect Transistor (FET) comprising a channel structure 122, a source structure 123 and a drain structure 124.

Figure 3:
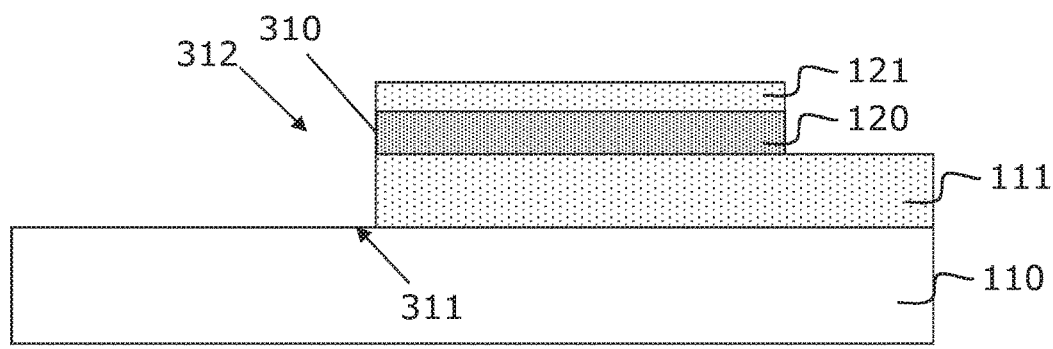
FIG. 3 shows a cross-sectional view of the structure of FIG. 1 after an insulating layer has been patterned in vertical alignment to an outer edge of a sacrificial structure.

FIG. 3 shows a cross-sectional view of a structure 300 after the insulating layer 111 has been patterned in vertical alignment to an outer edge 310 of the sacrificial structure 120. More particularly, the insulating layer 111 has been patterned and etched down to the substrate 110 at at least one edge of (or through a part of) the sacrificial structure 120 but preferably only one location (edge or part) for single crystalline material formation. This has formed a sidewall 312 in the protection layer 121, the sacrificial structure 120 and the insulating layer 111. This can be done by suitable lithography and subsequent etching steps. As a result, a seed surface 311, adjacent to the sidewall 312, has been formed in order to act as a seed surface for growing a semiconductor structure.

Figure 4:
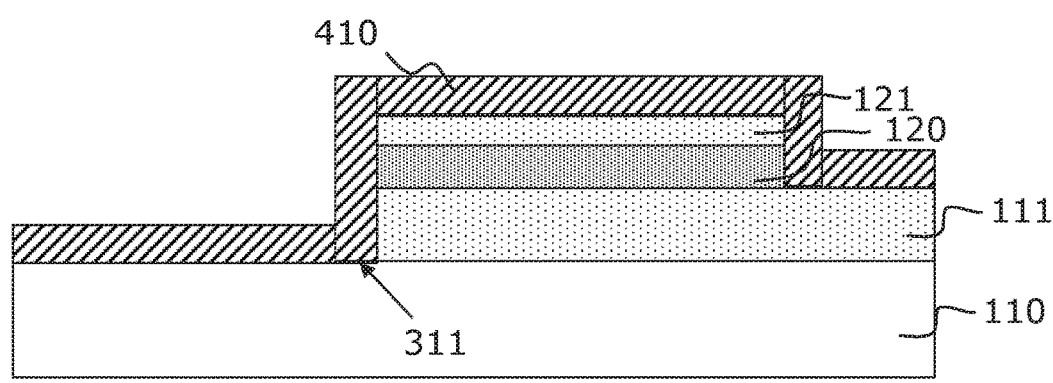
FIG. 4 shows a cross-sectional view of the structure of FIG. 3 after the deposition of a spacer layer.

FIG. 4 shows a cross-sectional view of a structure 400 after the deposition of a spacer layer 410 by conformal deposition of a spacer material. More particularly, the spacer layer 410 has been conformally deposited on the exposed surface of the substrate 110 including the seed surface 311, on the protection layer 121, on the sidewalls of the sacrificial structure 120 and insulating layer 111. The spacer material may be preferably embodied as $SiN_X$ or derivatives thereof. The conformal deposition of the spacer material may be performed by methods well known in the art such as PECVD or PEALD.

Figure 5:
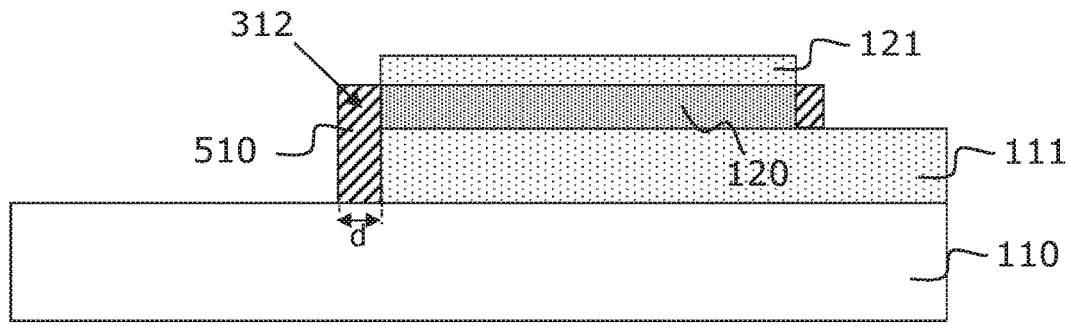
FIG. 5 shows a cross-sectional view of the structure of FIG. 4 after a spacer has been formed at a sidewall of the insulating layer and the sacrificial structure.

FIG. 5 shows a cross-sectional view of a structure 500 after a spacer 510 has been formed at the sidewall 312 of the insulating layer 111 and the sacrificial structure 120 by selectively etching the spacer layer 410. The spacer 510 may be formed e.g. by dry etching the spacer layer 410 by Inductively Coupled Plasma (ICP) etching, Reactive Ion Etching (RIE), Electron Cyclotron Resonance (ECR) etching, or Helicon etching. These techniques allow a precise control of the etching process and hence a precise control of the formation of the spacer 510. In particular the spacer thickness d and the corresponding cross section area of the spacer 510 at the surface of the substrate 110 can be very well and precisely controlled. The area of the seed surface of the substrate 110 is defined by the cross section area of the spacer 510 at the surface of the substrate 110. During the etching process the protection layer 121 protects the sacrificial structure 120 and prevents etching of the sacrificial structure 120. At this stage the spacer 510 effectively connects the sacrificial structure 120 to the substrate 110.

Figure 6:
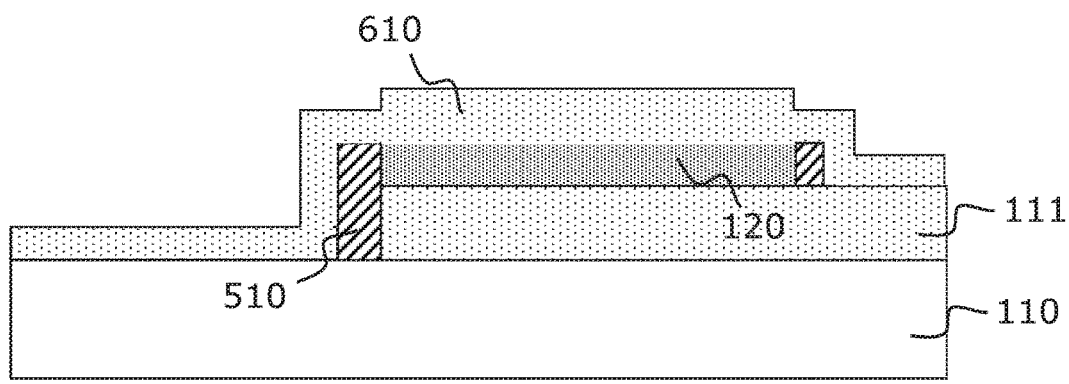
FIG. 6 shows a cross-sectional view of the structure of FIG. 5 after a cavity layer has been formed on all exposed surfaces.

FIG. 6 shows a cross-sectional view of a structure 600 after a cavity layer 610 has been formed on all exposed surfaces of the structure 500. More particularly, the cavity layer 610 was formed on the sacrificial structure 120, on the spacer 510, the substrate 110 and on the insulating layer 111. The cavity layer 610 is typically an insulating layer, e.g. of an oxide such as silicon oxide, but might also be a layer of carbon or other material which suppresses deposition of the semiconductor during the subsequent selective growth of a replacement structure. According to an embodiment the cavity layer 610 may be formed e.g. as blanket oxide layer using conformal deposition techniques as mentioned above. According to the illustrated embodiment the cavity layer 610 includes the protection layer 121. In other words, the protection layer 121 establishes or forms a part of the cavity layer 610.

In FIG. 6 it is assumed that the same material, e.g. of $SiO_2$ is used for both the protection layer 121 and the cavity layer 610 of. Nevertheless, according to other embodiments the cavity layer may be formed with two different materials, where a first material may be used for the protection layer and a second material may be used for the rest of the cavity layer.

According to embodiments the material of the cavity layer 610 is selected to have a low sticking coefficient, and hence low nucleation probability, in order to achieve nucleation from the seed surface 311 only and not from the inner surfaces of the cavities 810 and 910 defined in descriptions of FIG. 8 and FIG. 9 below, allowing low defect density in the regrown semiconductor material of replacement structure.

Figure 7:
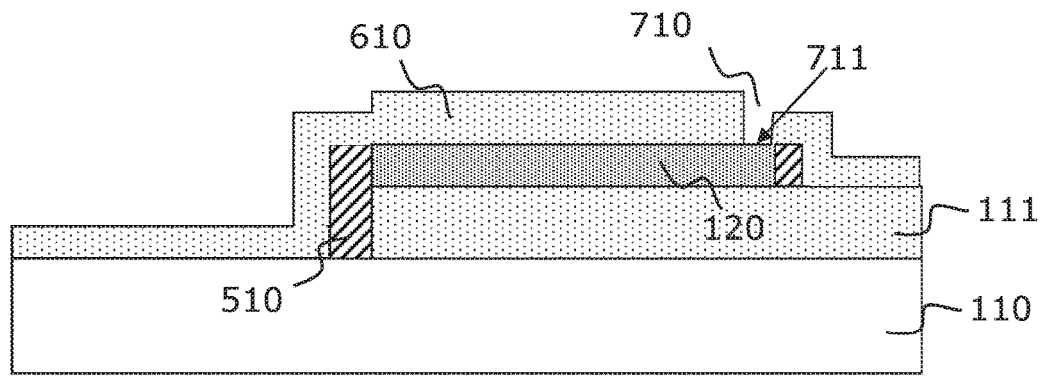
FIG. 7 shows a cross-sectional view of the structure of FIG. 6 after an opening 710 has been formed in the cavity layer.

FIG. 7 shows a cross-sectional view of a structure 700 after an opening 710 has been formed in the cavity layer 610. This has exposed a surface 711 of the sacrificial structure 120. The formation of the opening 710 may be performed by lithography and subsequent wet or dry etching techniques.

Figure 8:
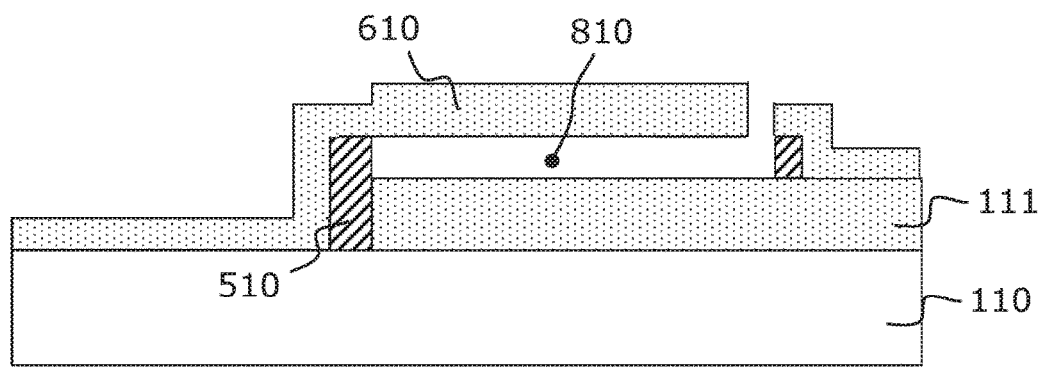
FIG. 8 shows a cross-sectional view of the structure of FIG. 7 after the sacrificial material of the sacrificial structure has been selectively removed.

FIG. 8 shows a cross-sectional view of a structure 800 after the sacrificial material of the sacrificial structure 120 has been removed without etching the spacer 410 and cavity layer 610. This has formed a first cavity 810. In general, the sacrificial material removal is performed using a selective etching technique. The selection of the selective etching technique may depend on the materials used for the sacrificial structure 120, the spacer 410, and cavity layer 610. There are, for example, etching techniques available that remove amorphous silicon (sacrificial material) selectively to $SiN_x$ (spacer material) and $SiO_2$ (cavity layer material). According to a preferred embodiment the sacrificial material may be $Si_xGe_{1-x}$ and the selective etching may be performed by dry etching with e.g. xenon difluoride ($XeF_2$) or wet etching with e.g. TMAH.

Figure 9:
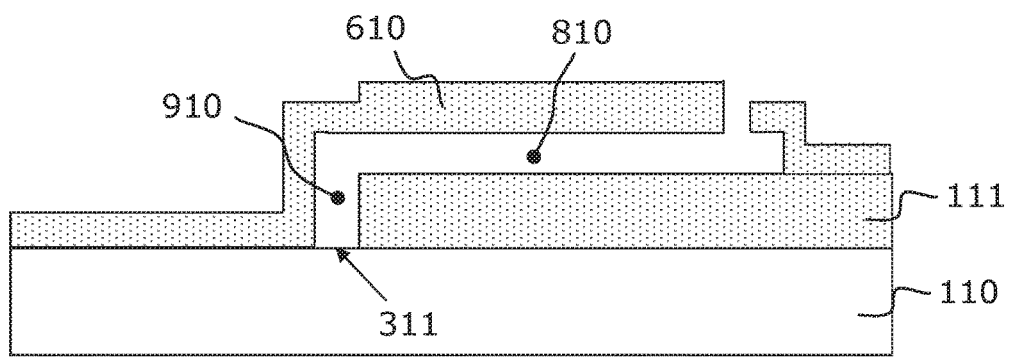
FIG. 9 shows a cross-sectional view of the structure of FIG. 8 after the spacer has been selectively removed.

FIG. 9 shows a cross-sectional view of a structure 900 after the spacer 510 has been selectively removed. This has formed a second cavity 910 connecting the first cavity 810 to the seed surface 311 of the substrate 110.

The selective removal of the spacer 510 may be performed by suitable selective etching techniques that are chosen to be such that they only etch the material of the spacer 510, but neither the material of the cavity layer 610 nor the substrate 110. Accordingly the etching stops at the seed surface 311 of the substrate 110. In case the spacer 410 is embodied as spacer comprising $SiN_X$ as spacer material, the selective etching may be performed e.g. with hot phosphoric acid ($H_3PO_4$). A preferred temperature range for the hot phosphoric acid etching is 150° C. to 180° C.

Figure 10:
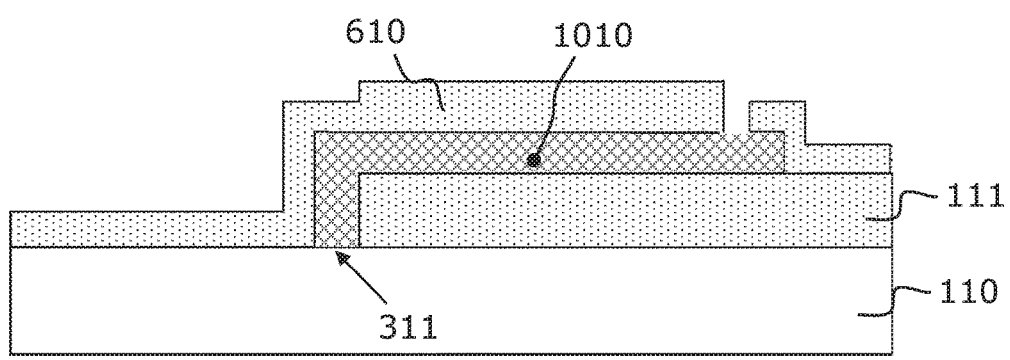
FIG. 10 shows a cross-sectional view of the structure of FIG. 11 after growing from the seed surface a replacement structure in the cavity.

FIG. 10 shows a cross-sectional view of a structure 1000 after growing from the seed surface 311 via the second cavity 910 a replacement structure 1010 comprising a semiconductor material in the first cavity 810. As a result, the sacrificial material of the sacrificial structure 120 was replaced with the semiconductor material of the replacement structure 1010. The growth of the replacement structure 1010 may be performed in particular by selective epitaxy in any suitable deposition system. For example, metal organic chemical vapor deposition (MOCVD), atmospheric pressure CVD, low or reduced pressure CVD, ultra-high vacuum CVD, molecular beam epitaxy (MBE) or atomic layer deposition (ALD) techniques can be employed.

FIG. 11 shows a cross-sectional view of a structure 1100 after removal of the cavity layer 610. This may be done by suitable etching techniques.

FIG. 12 shows a top view of the structure 1100. As can be seen, the sacrificial structure 120 shown in FIG. 1 and FIG. 2 has been replaced with the replacement structure 1010 shown in FIG. 11 and FIG. 12. The replacement structure 1010 has the same form and shape as the sacrificial structure 120, but comprises a different material than the sacrificial structure 120.

Hence according to embodiments of the invention the sacrificial structure 120 has been used as a template for forming a replacement structure 1010 of a different material having the same form/shape as the sacrificial structure 120 as well as the same position on the substrate 110 as the sacrificial structure 120.

The semiconductor material of the replacement structure 1010 may be generally any material suitable for epitaxial growth. According to preferred embodiments the second semiconductor material may be a group III-V compound semiconductor material. The group III-V material could be a binary material such, as for example, Gallium Arsenide (GaAs) or Gallium Antimonide (GaSb). The group III-V material could also be a tertiary material such as, for example, Indium Gallium Arsenide (InGaAs) or Indium Gallium Antimonide (InGaSb). According to other embodiments group II-VI semiconductor compounds, mixed II-VI compounds, and IV-IV compounds may be used. According to another preferred embodiment $In_xGa_{1-x}As$ where x=0 to 1 may be used. According to other embodiments further alloyed combinations of (In, Ga) and (As, Sb, P) may be used. Further examples include gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), lead selenide (PbSe), lead teluride (PbTe), lead sulfide selenide (PbSSe) and the like.

FIGS. 13-22 show successive stages of a method for fabricating hybrid semiconductor circuits comprising semiconductor devices with different semiconductor materials.

FIG. 13 illustrates a cross sectional view of an initial structure 1300. The initial structure 1300 comprises a substrate 110. The substrate 110 may be embodied in the same way as the substrate 110 described with reference to FIG. 1, i.e. it may be a bulk semiconductor substrate, a substrate comprising an insulating layer such as a silicon on insulator (SOI) substrate or a hybrid substrate.

On the substrate 110 an insulating layer 111 is provided. The insulating layer 111 may be embodied e.g. as a dielectric layer, in particular as buried oxide (BOX) layer. The insulating layer 111 may be formed by known methods as described with reference to FIG. 1 and may comprise a dielectric material as listed with reference to FIG. 1. The thicknesses of the substrate 110 and the insulating layer 111 can be any suitable thicknesses.

On the insulating layer 111 a first semiconductor structure 1310 comprising a first semiconductor material is provided. Furthermore, a sacrificial structure 1320 is provided on the insulating layer 111 comprising also the first semiconductor material as sacrificial material. While the first semiconductor structure 1310 is already a "final structure" that will be subsequently used to form a first semiconductor device, the sacrificial structures 1320 establishes a negative mold for a cavity to be formed subsequently. According to this embodiment the first semiconductor material and accordingly also the sacrificial material may comprise $Si_xGe_{1-x}$ where x=0 to 1. This allows to form a first semiconductor device comprising $Si_xGe_{1-x}$ on the first semiconductor structure. By using the first semiconductor material also for the sacrificial structure, the first semiconductor structure and the sacrificial structure can be fabricated simultaneously in one fabrication step by a plurality of well-known and established fabrication processes. In particular, the first semiconductor structure and the sacrificial structure can be fabricated at the same lithography level. The first semiconductor structure 1310 and the sacrificial structure 1320 may be fabricated in a technology that is particularly suitable for the first semiconductor material and they may have any desired form and shape. Fabrication processes such as lithography and etching processes may be adapted and optimized for the respective first semiconductor material. On top of the first semiconductor structure 1310 a protection layer 1311 is arranged and on the sacrificial structure 1320 a protection layer 1321. The protection layers 1311 and 1321 may be embodied as oxide layers, e.g. as a layers of $SiO_2$. The protection layers 1311 and 1321 may have been formed by suitable deposition techniques as known in the art. The protection layers protect the underlying first semiconductor structure 1310 and the sacrificial structure 1320 during subsequent etching processes and facilitates a subsequent formation of spacers as will be described below in more detail.

FIG. 14 shows as structure 1400 a corresponding top view of the structure 1300 of FIG. 13. More particularly, FIG. 13 is a cross section A-A of the top view of FIG. 14. As illustrated in FIG. 14, the first semiconductor structure 1310 is embodied as base structure for a first Field Effect Transistor (FET) comprising a channel structure 1312, a source structure 1313 and a drain structure 1314. The sacrificial structure 1320 is also embodied as base structure for a second Field Effect Transistor (FET) comprising a channel structure 1322, a source structure 1323 and a drain structure 1324.

Figure 15:
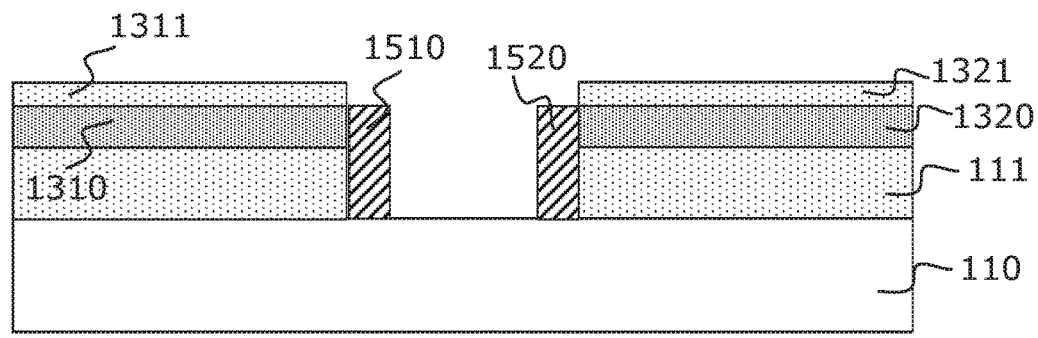
FIG. 15 shows a cross-sectional view of the structure of FIG. 13 after a first spacer and a second spacer have been formed at sidewalls of an insulating layer and a sacrificial structure.

FIG. 15 shows a cross-sectional view of a structure 1500 after a first spacer 1510 has been formed at a sidewall of the insulating layer 111 and the first semiconductor structure 1310. Furthermore, a second spacer 1520 has been formed at a sidewall of the insulating layer 111 and the sacrificial structure 1320. The formation of the first spacer 1510 and the second spacer 1520 may generally be performed as described in detail with reference to FIGS. 3 to 5. This includes patterning the insulating layer 111 in vertical alignment to an outer edge of the first semiconductor structure 1310 and an outer edge of the sacrificial structure 1320, i.e. patterning and etching the insulating layer 111 down to the substrate 110 at at least one edge of the first semiconductor structure 1310 and the sacrificial structure 1320. Then a spacer layer (not explicitly shown) was deposited by conformal deposition of a spacer material on the exposed surfaces of the substrate 110, the protection layers 1311, 1321, the sacrificial structures 1310, 1320 and on the insulating layer 111. The spacer material may again be preferably embodied as $SiN_X$ or derivates thereof and the conformal deposition of the spacer material may be performed by methods well known in the art such as PECVD or PEALD. Then the first spacer 1510 and the second spacer 1520 have been formed by selectively etching the spacer layer, e.g. by dry etching techniques such as Inductively Coupled Plasma (ICP) etching, Reactive Ion Etching (RIE), Electron Cyclotron Resonance (ECR) etching, and Helicon etching. As a result, the first spacer 1510 connects the first semiconductor structure 1310 with the substrate 110 and the second spacer 1520 connects the sacrificial structure 1320 with the substrate 110. While the second spacer 1520 will subsequently be used to form a cavity connecting a seed surface of the substrate with a cavity to grow a replacement structure, the first spacer 1510 does not have a specific function, but was just fabricated in parallel to the second spacer 1520 to ease fabrication.

Figure 16:
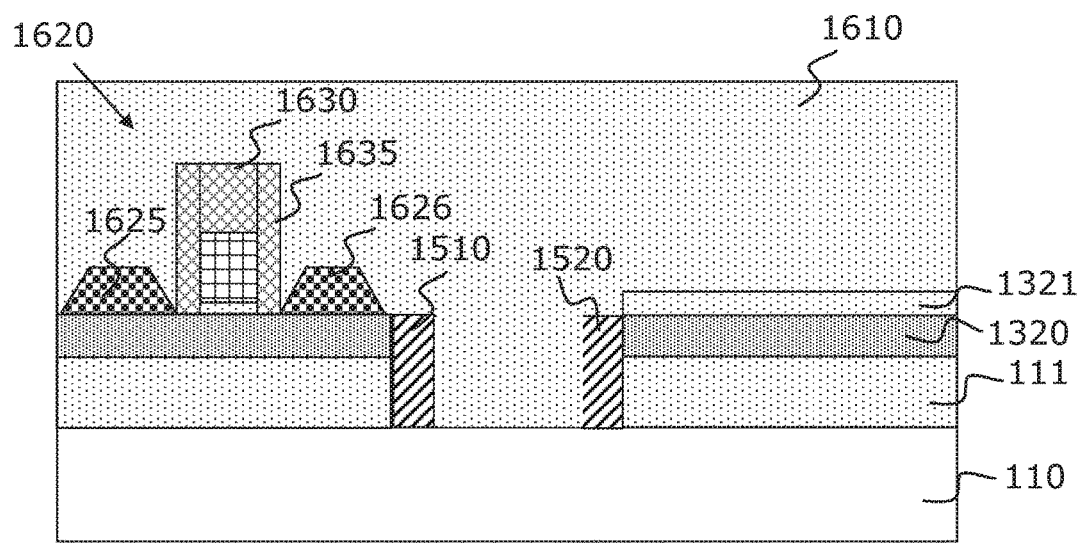
FIG. 16 shows a cross-sectional view of the structure of FIG. 15 after forming a first semiconductor device on a first semiconductor structure.

FIG. 16 shows a cross-sectional view of a structure 1600 after forming a first semiconductor device 1620 on the first semiconductor structure 1310. According to this embodiment the first semiconductor device 1620 is a field effect transistor (FET) 1620 and the first semiconductor structure 1310 comprises a channel structure 1312 of the FET 1620. The channel structure 1312 may have a thickness of, for example, about 5 nm that corresponds to a desired channel thickness of the FET 1620. The FET 1620 may be in particular a pFET. On the channel structure 1312 there is disposed a gate stack 1630 of the FET 1620. The gate stack 1630 may comprises a gate dielectric layer, a gate metal layer and a gate cap layer. The gate dielectric layer may be embodied e.g. as layer comprising $HfO_2$, HfON, HfSiON, $ZrO_2$, ZrON, $LaO_3$, La—Al—O, La—Lu—O, SiN or SiON. The gate metal layer may be embodied e.g. as a layer of Ti, Hf, TiN, W, Al or poly-silicon. The gate cap layer may be embodied e.g. as a layer comprising SiN or derivatives thereof or as a layer comprising $SiO_2$. On sidewalls of the gate stack 1630 insulating spacers 1635 have been formed that insulate the gate stack 1630 from a raised source layer 1625 and a raised drain layer 1626. The raised source layer 1625 and the raised drain layer 1626 may be formed by selective epitaxy. The raised source layer 1625 and the raised drain layer 1626 comprises the first semiconductor material, e.g. as $Si_xGe_{1-x}$, where x=0 to 1. According to preferred embodiments the ratio x of Si in the SiGe alloy of the raised source layer 1625 and the raised drain layer 1626 may be different from the ratio x of Si in the SiGe alloy of the channel structure 1312. Such a different ratio may induce strain in the channel structure 1312 which results in a compressed channel structure 1312 and an improved device performance. The raised source layer 1625 and the raised drain layer 1626 may be doped with a p-type dopant, e.g. with boron (B). The doping can be preferably performed by in-situ doping during the selective epitaxy step.

After formation of the first semiconductor device 1620 a cavity layer 1610 has been formed on all exposed surface and more particularly on the first semiconductor device 1620, the first spacer 1510, the second spacer 1520, the substrate 111 and the sacrificial structure 1320. The cavity layer 1610 may be formed e.g. as blanket oxide layer using conformal deposition techniques as mentioned above. The cavity layer 1610 may be preferably embodied as $SiO_2$ layer. The cavity layer 1610 includes the protection layer 1321, while the protection layer 1311 was removed before formation of the FET 1620. In FIG. 16 it is again assumed that both the protection layer 1321 and the cavity layer 1610 are formed of the same material, e.g. of $SiO_2$. Nevertheless, according to other embodiments the cavity layer may be formed of two different materials for the protection layer and the rest of the cavity layer.

Figure 17:
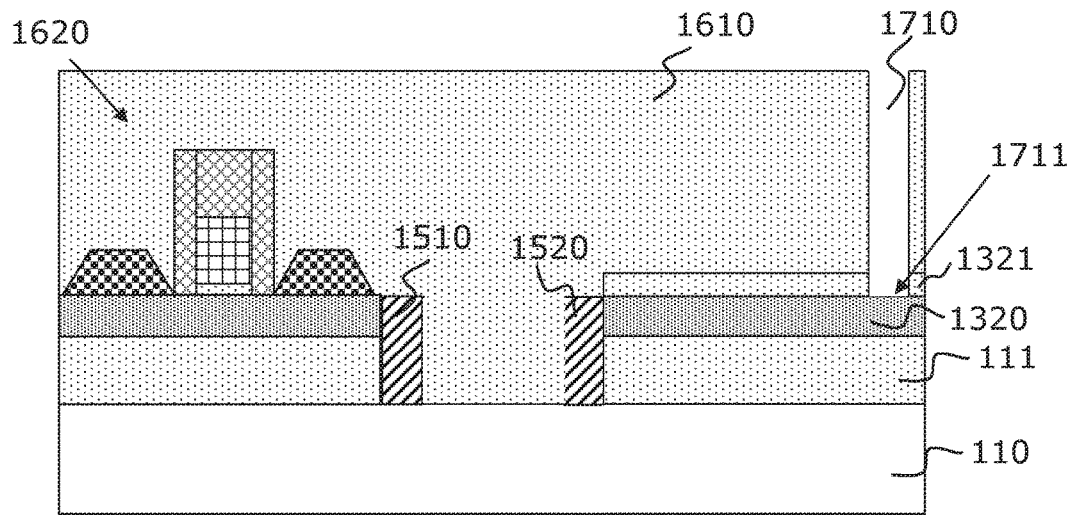
FIG. 17 shows a cross-sectional view of the structure of FIG. 16 after an opening has been formed in a cavity layer.

FIG. 17 shows a cross-sectional view of a structure 1700 after an opening 1710 has been formed in the cavity layer 1610. This has exposed a surface 1711 of the sacrificial structure 1320. The formation of the opening 1710 may be performed by lithography and subsequent wet or dry etching techniques.

Figure 18:
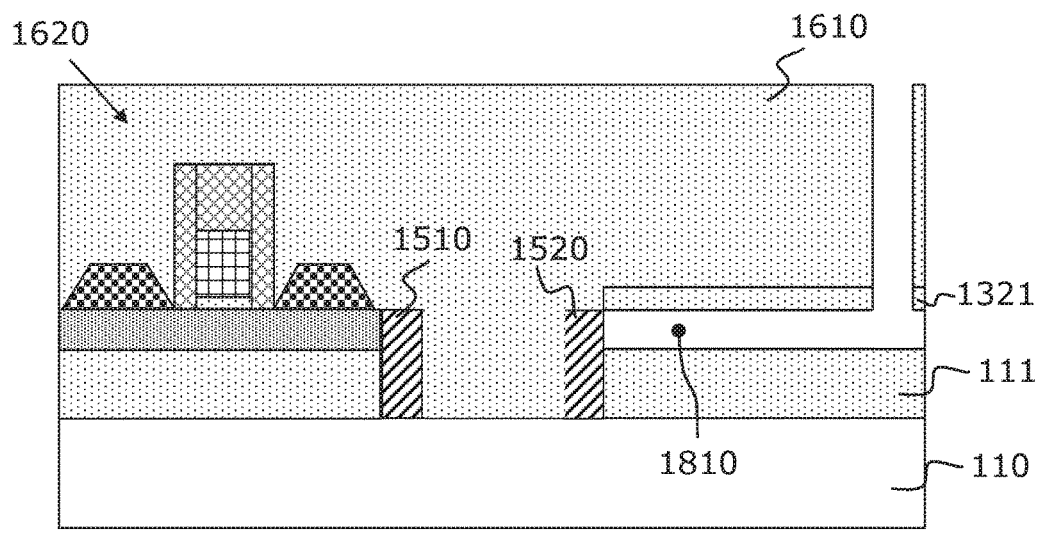
FIG. 18 shows a cross-sectional view of the structure of FIG. 17 after removal of a sacrificial structure.

FIG. 18 shows a cross-sectional view of a structure 1800 after the first semiconductor material of the sacrificial structure 1320 has been selectively removed. This has formed a first cavity 1810. The selective removal may be performed by selective etching techniques. According to a preferred embodiment dry etching with e.g. xenon difluoride ($XeF_2$) or wet etching with e.g. TMAH may be used. The etching technique is chosen to be such that it only etches the first semiconductor material of the sacrificial structure 1320, but not the material of the cavity layer 1610 nor the material of the second spacer 1520. Accordingly the etching stops at the second spacer 1520.

Figure 19:
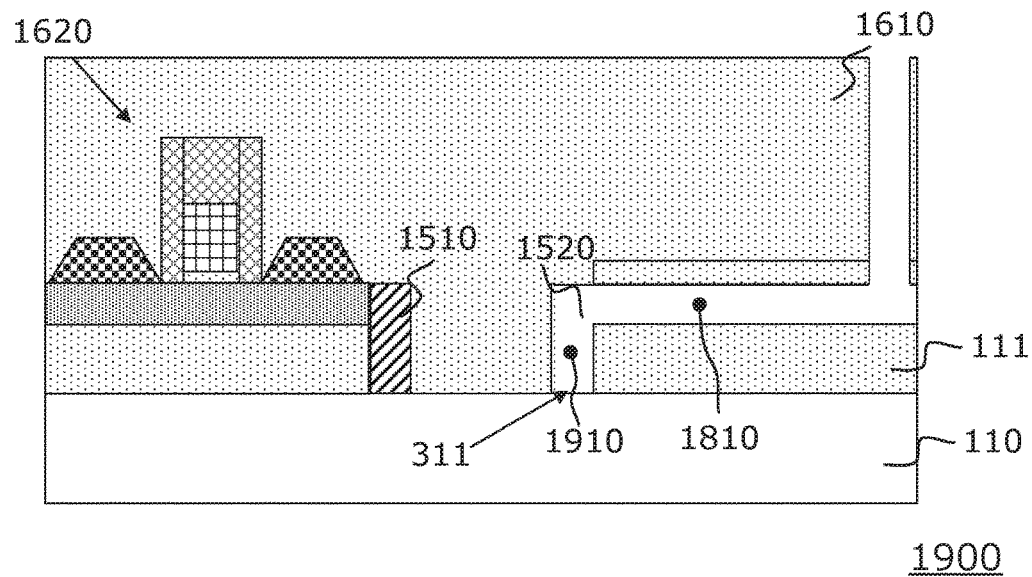
FIG. 19 shows a cross-sectional view of the structure of FIG. 18 after the second spacer has been selectively removed.

FIG. 19 shows a cross-sectional view of a structure 1900 after the second spacer 1520 has been selectively removed. This has formed a second cavity 1910 connecting the first cavity 1810 to a seed surface 311 of the substrate 110.

The selective removal of the second spacer 1520 may be performed by suitable selective etching techniques that are chosen to be such that they only etch the spacer material of the second spacer 1520, but not the material of the cavity layer 1610 nor the substrate 110. Accordingly the etching stops at the substrate 110. In case the second spacer 1520 is embodied as spacer comprising $SiN_X$ as spacer material, the selective etching may be performed e.g. with hot phosphoric acid ($H_3PO_4$). A preferred temperature range for the hot phosphoric acid etching is 150° C. to 180° C.

Figure 20:
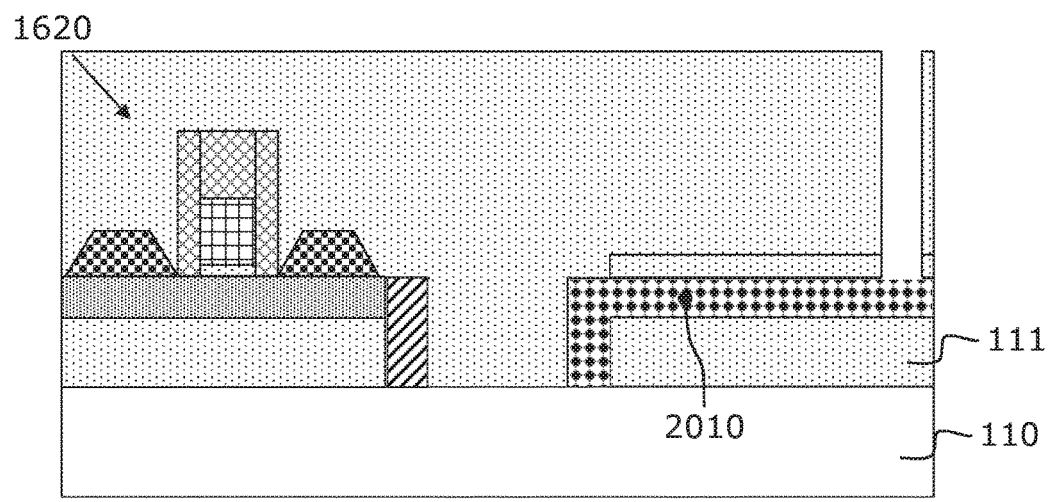
FIG. 20 shows a cross-sectional view of the structure of FIG. 19 after growing from a seed surface a second semiconductor structure as replacement structure.

FIG. 20 shows a cross-sectional view of a structure 2000 after growing from the seed surface 311 via the second cavity 1910 a second semiconductor structure 2010 as replacement structure 2010 comprising a second semiconductor material in the first cavity 1810. As a result, the first semiconductor material used as sacrificial material was replaced with the second semiconductor material. The growth of the second semiconductor structure 2010 may be performed in particular by selective epitaxy in any suitable deposition system as described above.

The second semiconductor material of the replacement structure 2010 may be generally any material suitable for epitaxial growth. According to preferred embodiments the second semiconductor material may be a group III-V compound semiconductor material, a group II-VI semiconductor compound, a mixed II-VI compound or a IV-IV compounds. In particular, the examples mentioned with reference to FIGS. 11 and 12 may be used.

Figure 21:
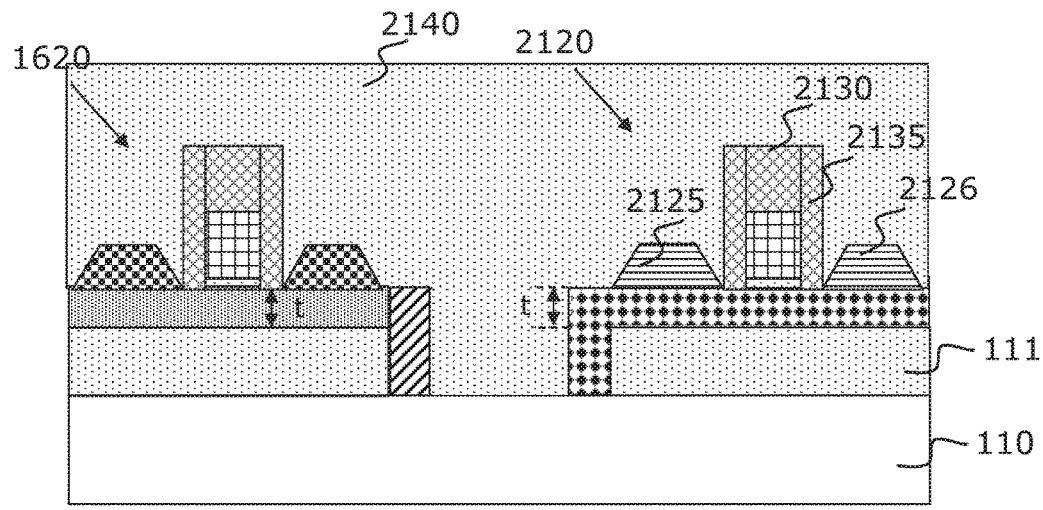
FIG. 21 shows a cross-sectional view of the structure of FIG. 20 after the fabrication of a second semiconductor device on the second semiconductor structure.

FIG. 21 shows as structure 2100 a cross-sectional view after the fabrication of a second semiconductor device 2120 on the second semiconductor structure 2010. According to this embodiment the second semiconductor device 2120 is a field effect transistor (FET) 2120 and the second semiconductor structure 2010 comprises a channel structure 1322 of the FET 2120. The FET 2120 may be in particular an nFET. The channel structure 1322 may have a thickness of, for example, in the range of 5 nm to 50 nm that corresponds to a desired channel thickness of the FET 2120. On the channel structure 1322 there is disposed a gate stack 2130 of the FET 2120. The gate stack 2130 may comprise a gate dielectric layer, a gate metal layer and a gate cap layer. The gate dielectric layer, the gate metal layer and the gate cap layer may comprise materials as described with reference to FIG. 16. On sidewalls of the gate stack 2130 insulating spacers 2135 have been formed that insulate the gate stack 2130 from a raised source layer 2125 and a raised drain layer 2126. The raised source layer 2125 and the raised drain layer 2126 may be formed by selective epitaxy. The raised source layer 2125 and the raised drain layer 2126 comprises the second semiconductor material and may hence be embodied as group III-V material or other suitable materials as mentioned above. The raised source layer 2125 and the raised drain layer 2126 may be doped with a n-type dopant, e.g. with Si, Sn, Se, Te or Ge. The doping can be preferably performed by in-situ doping during the selective epitaxy step. After formation of the second semiconductor device 2120 an oxide layer 2140 has been formed on all exposed surfaces. The oxide layer 2140 may be preferably embodied as $SiO_2$ layer.

Figure 22:
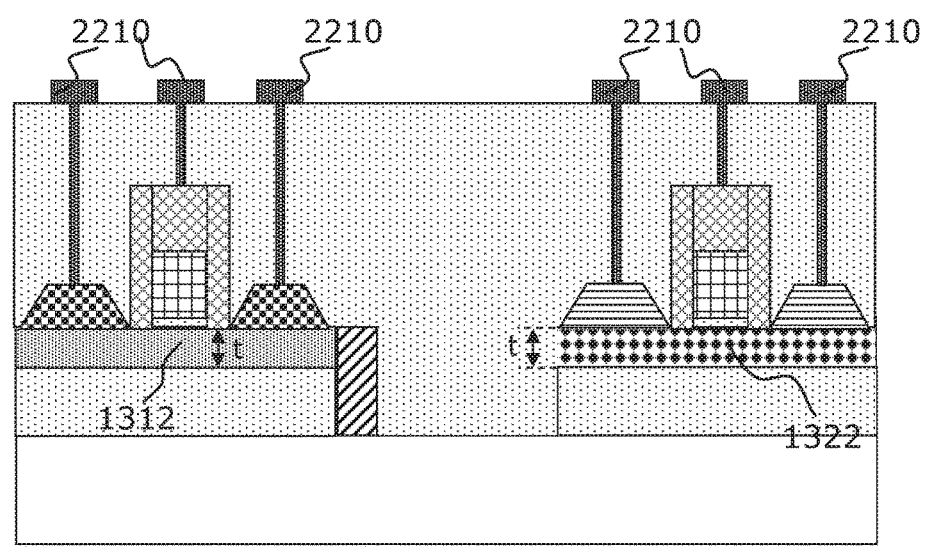
FIG. 22 shows a cross-sectional view of FIG. 22 after contact structures to the first and the second semiconductor device have been provided.

FIG. 22 shows a cross-sectional view of a structure 2200 that comprises contact structures 2210 that provide gate/drain/source contacts for the first FET 1620 and the second FET 2120. The contact structures 2210 contact the gates/sources/drains from the top. For this, in a first step corresponding holes or trenches extending to the top surface of the raised source/drain layers may be formed in the insulating layer, e.g. by lithography and etching. Then in a subsequent step the holes/trenches may be filled with metal, e.g. by ALD.

According to embodiments the channel structure 1312 of the first FET 1620 and the channel structure 1322 of the second FET 2120 have the same thickness t. This enables similar control of short channel effects in FET 1620 and FET 2120.

As the sacrificial structure 1320 can be formed simultaneously as the first semiconductor structure and of the same material as the first semiconductor structure, the same channel thickness of the first FET 1620 and the second FET 2120 can be ensured in an efficient and reliable way.

FIGS. 23-28 show successive stages of a method according to an embodiment of the invention that uses a spacer that is formed as bilayer.

Figure 23:
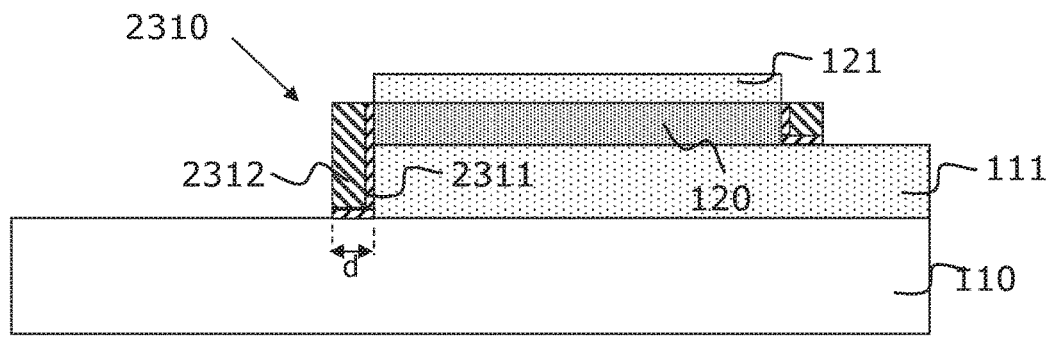
FIG. 23 shows a cross-sectional view of a structure comprising a spacer that is formed as bilayer.

FIG. 23 shows a cross-sectional view of a structure 2300. The structure 2300 comprises a substrate 110, an insulating layer 111, a sacrificial structure 120 and a protection layer 121 as described in more detail with reference to FIGS. 1 to 3. The structure 2300 comprises furthermore a spacer 2310 that is formed as bilayer. The spacer 2310 comprises a first spacer sublayer 2311 and a second spacer sublayer 2312. The forming of the first spacer sublayer 2311 and the second spacer sublayer 2312 may be performed by conformal deposition of a conformal first spacer sublayer (not shown) that covers all exposed surfaces of a structure corresponding to the structure 300 of FIG. 3 and a subsequent conformal deposition of a second conformal spacer sublayer. Then in a first etching step the second conformal spacer sublayer has been selectively etched down and in a second etching step the first conformal spacer sublayer has been selectively etched down to form the spacer 2310. The spacer 2310 may be formed e.g. by dry etching the first and the second conformal spacer sublayers by Inductively Coupled Plasma (ICP) etching, Reactive Ion Etching (RIE), Electron Cyclotron Resonance (ECR) etching, and Helicon etching. These techniques allow a precise control of the etching process and hence a precise control of the formation of the spacer 2310. In particular the spacer thickness d and the corresponding cross section area of the spacer 2310 at the surface of the substrate 110 can be very well and precisely controlled. The area of the seed surface of the substrate 110 is defined by the cross section area of the spacer 2310 at the surface of the substrate 110. During the etching process the protection layer 121 protects the sacrificial structure 120, prevents that the sacrificial structure 120 is etched and ensures that the spacer 2310 covers the complete sidewall of the sacrificial structure 120.

The first spacer sublayer 2311 may be formed as dielectric layer, in particular as high-k layer. According to one preferred embodiment the first spacer sublayer is formed as a layer of $Al_2O_3$. The second spacer sublayer 2312 may be formed in particular as a layer of amorphous silicon or polysilicon.

The second spacer sublayer 2312 facilitates the use of a very thin first spacer sublayer 2311, e.g. a first spacer sublayer 2311 that is only a few nm thin. According to such an embodiment the second spacer sublayer 2312 increases the total spacer thickness and functions as a vertical etch stop during the etching of the first conformal spacer sublayer. Furthermore, the increased total spacer thickness provides an enlarged connection between the substrate and the cavity structure which may facilitate the growth of the replacement structure.

Figure 24:
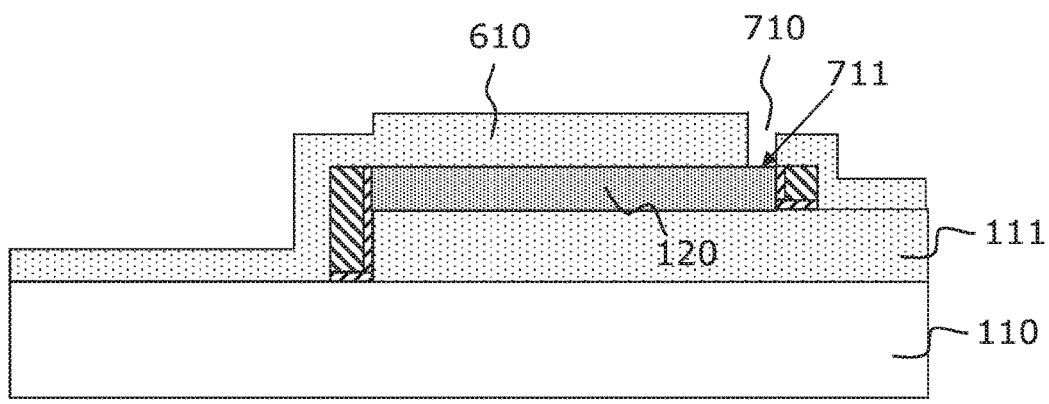
FIG. 24 shows a cross-sectional view of view of the structure of FIG. 23 after a cavity layer has been formed that confines a sacrificial structure.

FIG. 24 shows a cross-sectional view of a structure 2400 after a cavity layer 610 has been formed that confines the sacrificial structure 120. The structure 2400 may be formed by steps corresponding to the steps as described with reference to FIG. 6 and FIG. 7. The cavity layer 610 may be formed e.g. as blanket oxide layers or combination of SiO2 and SiN layers using conformal deposition techniques. The cavity layer 610 includes again the protection layer 121. Furthermore, an opening 710 has been formed in the cavity layer 610, thereby exposing a surface 711 of the sacrificial structure 120.

Figure 25:
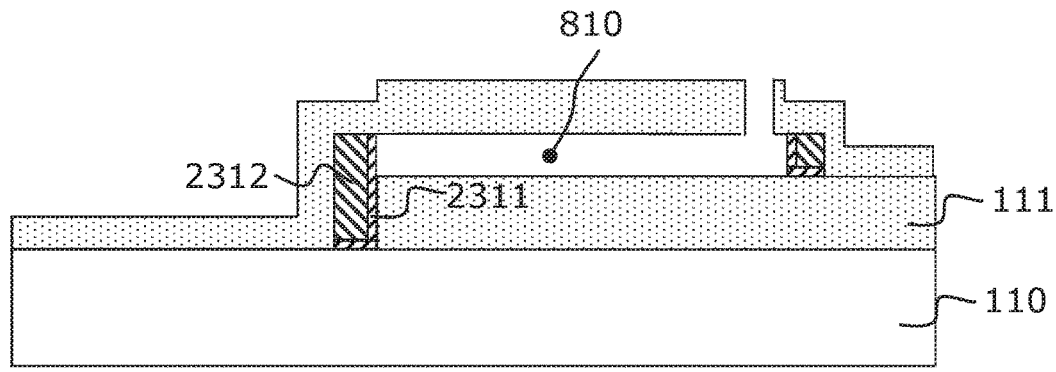
FIG. 25 shows a cross-sectional view of the structure of FIG. 24 after the sacrificial material of the sacrificial structure has been selectively removed.

FIG. 25 shows a cross-sectional view of a structure 2500 after the sacrificial material of the sacrificial structure 120 has been selectively removed. This has formed a first cavity 810. The selective removal may be performed by selective etching techniques as described above with reference to FIG. 8.

Figure 26:
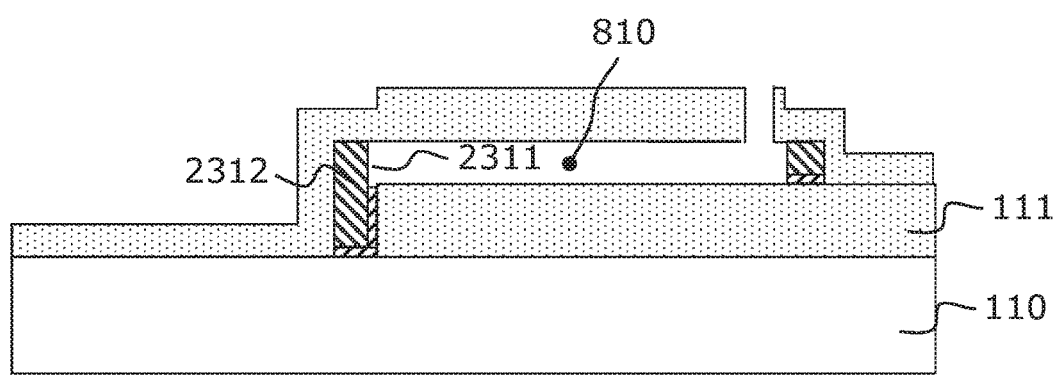
FIG. 26 shows a cross-sectional view of the structure of FIG. 25 after selectively etching a first part of a first spacer sublayer.

FIG. 26 shows a cross-sectional view of a structure 2600 after selectively etching a first part of the first spacer sublayer 2311. The selective removal of the first part of the first spacer sublayer 2311 may be performed by suitable selective etching techniques that are chosen to be such that they only etch the spacer material of the first spacer sublayer 2311, but not the material of the cavity layer 610, the protection layer 121, the insulating layer 111, the second spacer sublayer 2312 and the substrate 110. Accordingly the etching stops at the second spacer sublayer 2312.

Figure 27:
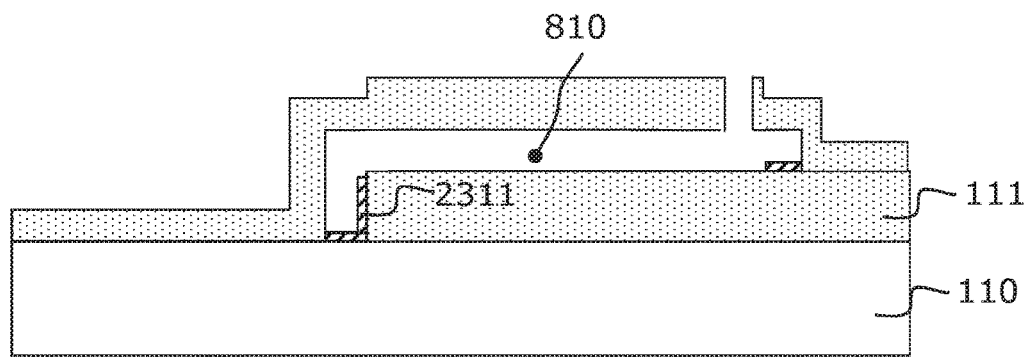
FIG. 27 shows a cross-sectional view of the structure of FIG. 16 after selectively etching a second spacer sublayer.

FIG. 27 shows a cross-sectional view of a structure 2700 after selectively etching the second spacer sublayer 2312. The selective removal of the second spacer sublayer 2312 may be performed by suitable selective etching techniques that are chosen to be such that they only etch the spacer material of the second spacer sublayer 2312, but not the material of the cavity layer 610, the protection layer 121, the insulating layer 111 and the first spacer sublayer 2311. Accordingly the etching stops at a second part of the first spacer sublayer 2311.

Figure 28:
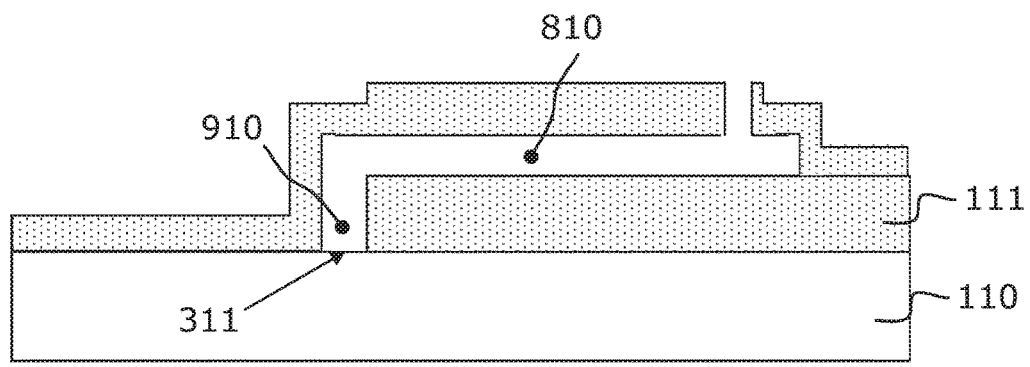
FIG. 28 shows a cross-sectional view of the structure of FIG. 27 after selectively etching the second part of the first spacer sublayer.

FIG. 28 shows a cross-sectional view of a structure 2800 after selectively etching the second part of the first spacer sublayer 2311 down to the substrate 110. This has formed a second cavity 910 connecting the first cavity 810 to a seed surface 311 of the substrate 110.

Figure 29:
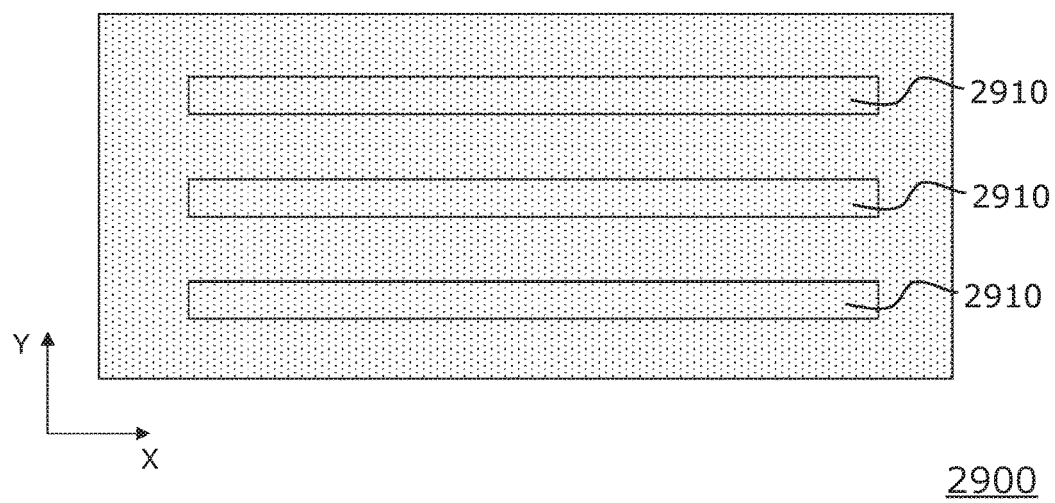
FIG. 29 illustrates a top view of an initial structure comprising a plurality of fin structures.

FIG. 29 illustrates a top view of a structure 2900 that may be used as an initial structure according to embodiments of the invention. The structure 2900 comprises a plurality of fin structures 2910 as sacrificial structures that are arranged in parallel to each other. The fin structures 2910 may be preferably embodied as structures comprising where x=0 to 1. With methods and techniques described above these fin structures 2910 of $Si_xGe_{1-x}$ may be replaced with fin structures of III-V materials.

Figure 30:
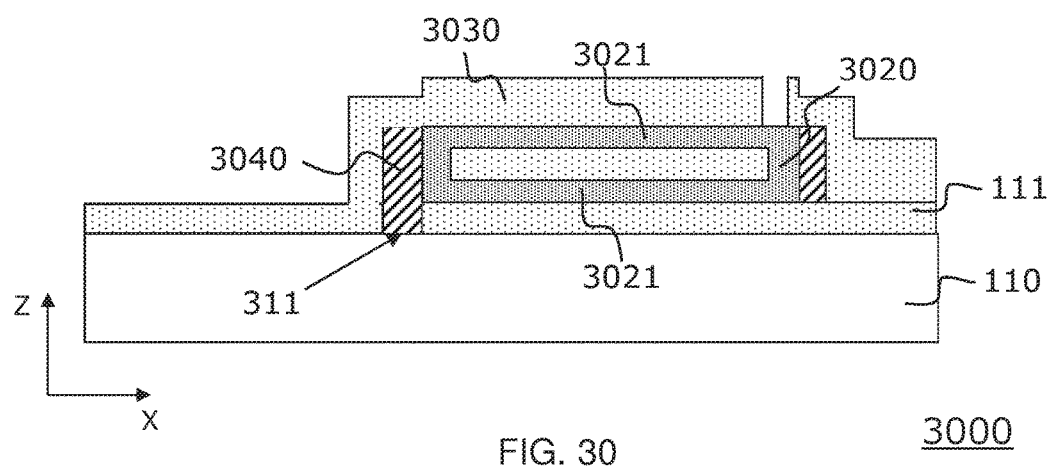
FIG. 30 shows a structure comprising a sacrificial structure that comprises two or more nanowires that are arranged vertically in a stacked manner.

FIG. 30 illustrates another example how methods according to embodiments of the invention can be used to replace 3-dimensional structures of a sacrificial material with a desired semiconductor material. More particularly, FIG. 30 shows a structure 3000 comprising a sacrificial structure 3020 that comprises two or more nanowires 3021 that are arranged vertically in a z-direction in a stacked manner. The sacrificial structure 3020 with the nanowires 3021 is confined by a cavity layer 3030 and at sidewalls of the sacrificial structure 3020 a spacer 3040 is arranged. According to embodiments the nanowires 3021 are $Si_xGe_{1-x}$ nanowires. With methods and techniques described above these nanowires 3021 can be replaced with nanowires of III-V materials by etching the sacrificial structure 3020 and the spacer 3040 and grow the III-V nanowires in the resulting cavity from a seed surface 311 of the substrate 110.

According to methods of embodiments of the invention prefabricated sacrificial structures of any suitable desired shape and form comprising the sacrificial material can be replaced with replacement structures of a different material having the same shape/form as the sacrificial structures. In other words, according to embodiments of the invention the prefabricated sacrificial structure can be used as a template for forming a replacement structure of a different material having the same form/shape as the sacrificial structure as well as the same position on the substrate as the sacrificial structure.

While illustrative examples are given above, it will be appreciated that the basic fabrication steps described above can be used to produce semiconductor structures of other materials, shapes and sizes. Materials and processing techniques can be selected as appropriate for a given embodiment, and suitable choices will be readily apparent to those skilled in the art.

While particular examples have been described above, numerous other embodiments can be envisaged. The seed surfaces for growing the replacement structures may be preferably a crystalline seed surface, but may according to other embodiments also be provided by an amorphous semiconductor substrate. If the seed has a well-defined crystalline orientation and if the crystal structure of the seed is a reasonable match to that of the growing crystal (for example a III-V compound semiconductor), the growing crystal can adapt this orientation. If the seed is amorphous or has an undefined crystal orientation, the growing crystal will be single crystalline but its crystal orientation will be random.

By appropriate shaping of the sacrificial structure in fabrication processes embodying the invention, replacement structures can be formed with any desired shapes and cross-sectional dimensions. Furthermore, the cross-section may be varied along the length of the replacement structure if desired. For example, replacement structures can be formed with curves, bends, corners, junctions and branches by appropriately shaping the cavity structure.

By fabrication methods according to embodiments of the invention group III-V FETs may be fabricated alongside pre-existing Si or SiGe FET, thereby creating hybrid circuits.

The disclosed semiconductor devices and circuits can be part of a semiconductor chip. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip may be integrated with other chips, discrete circuit elements, and/or other signal processing devices as part of either an intermediate product, such as a motherboard, or an end product. The end product can be any product that includes integrated circuit chips, ranging from toys and other low-end applications to advanced computer products having a display, a keyboard or other input devices, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor structure, comprising:
   providing a sacrificial structure comprising a sacrificial material on an insulating layer of a semiconductor substrate;
   forming a spacer of a spacer material connecting the sacrificial structure with the substrate;
   forming a cavity layer covering the sacrificial structure, the spacer and the substrate;
   forming an opening in the cavity layer, thereby exposing a surface of the sacrificial structure;
   selectively removing the sacrificial material, thereby forming a first cavity;
   selectively removing the spacer, thereby forming a second cavity connecting the first cavity to a seed surface of the substrate;
   growing from the seed surface via the second cavity a replacement structure comprising a semiconductor material in the first cavity, thereby replacing the sacrificial material with the semiconductor material.

2. A method as claimed in claim 1, wherein forming the spacer comprises:
   exposing the seed surface of the substrate by selectively etching the insulating layer;
   forming a spacer layer by conformal deposition of the spacer material;
   forming the spacer at sidewalls of the insulating layer and the sacrificial structure by selectively etching the spacer layer.

3. A method as claimed in claim 2, comprising:
   patterning the insulating layer in vertical alignment to an outer edge of the sacrificial structure, thereby exposing the seed surface of the substrate;
   forming the spacer layer by conformal deposition of the spacer material on the exposed seed surface of the substrate and on exposed surfaces of the sacrificial layer and the insulating layer.

4. A method as claimed in claim 2, comprising:
   forming an opening through the sacrificial layer and the insulating layer to the substrate, thereby exposing the seed surface of the substrate;
   forming the spacer layer by conformal deposition of the spacer material on the exposed seed surface of the substrate and on exposed surfaces of the sacrificial layer and the insulating layer.

5. A method as claimed in claim 1, comprising forming a semiconductor device on the replacement structure, wherein the replacement structure is an active layer of the semiconductor device.

6. A method as claimed in claim 1, comprising forming a semiconductor device on the replacement structure, wherein the replacement structure is a virtual substrate of the semiconductor device.

7. A method as claimed in claim 2, wherein the spacer layer comprises $SiN_X$ or derivatives thereof.

8. A method as claimed in claim 7, wherein forming the spacer comprises dry etching the spacer layer by one of: Inductively Coupled Plasma (ICP) etching, Reactive Ion Etching (RIE), Electron Cyclotron Resonance (ECR) etching, and Helicon etching.

9. A method as claimed in claim 1, wherein the area of the seed surface of the substrate is defined by the cross section area of the spacer at the surface of the substrate.

10. A method as claimed in claim 2, wherein the spacer layer is formed as bilayer comprising a first spacer sublayer and a second spacer sublayer.

11. A method as claimed in claim 10, wherein the first spacer sublayer is formed as high-k layer.

12. A method as claimed in claim 10, wherein the first spacer sublayer comprises one of: $Al_2O_3$, SiN, $HfO_2$ and $ZrO_2$ and the second spacer sublayer comprises one of: amorphous silicon and polysilicon.

13. A method as claimed in claim 10, comprising:
forming the first spacer sublayer;
forming the second spacer sublayer;
selectively etching a first part of the first spacer sublayer;
selectively etching the second spacer sublayer; and
selectively etching a second part of the first spacer sublayer.

14. A method as claimed in claim 1, wherein the sacrificial material comprises one of: $Si_xGe_{1-x}$ where x=0 to 1; poly-Silicon and amorphous Silicon.

15. A method as claimed in claim 1, wherein the semiconductor material of the replacement structure is comprised of one of: a group III-V compound material and a group II-VI compound material.

16. A method as claimed in claim 1, comprising:
providing a first semiconductor structure comprising a first semiconductor material on the insulating layer;
providing the sacrificial structure comprising the first semiconductor material as sacrificial material on the insulating layer;
forming a first spacer of the spacer material connecting the first semiconductor structure with the substrate;
forming a second spacer of the spacer material connecting the sacrificial structure with the substrate;
forming a first semiconductor device on the first semiconductor structure;
forming a cavity layer on the first semiconductor device, the first and the second spacer and the sacrificial structure;
forming an opening in the cavity layer of the sacrificial structure, thereby exposing a surface of the sacrificial structure;
selectively removing the first semiconductor material of the sacrificial structure, thereby forming the first cavity;
selectively removing the second spacer, thereby forming the second cavity connecting the first cavity to the seed surface of the substrate;
growing from the seed surface via the second cavity a second semiconductor structure as replacement structure comprising a second semiconductor material different from the first semiconductor material in the first cavity structure, thereby replacing the first semiconductor material with the second semiconductor material;
forming a second semiconductor device on the second semiconductor structure.

17. A method as claimed in claim 16, wherein the first semiconductor device is a Field Effect Transistor (FET) and the first semiconductor structure comprises a channel structure of the FET.

18. A method as claimed in claim 16, wherein the second semiconductor device is a Field Effect Transistors (FET) and the replacement structure comprises a channel structure of the FET.

19. A method as claimed in claim 16, wherein the first semiconductor device is a first Field Effect Transistor (FET), the first semiconductor structure comprises a channel structure of the first FET, the second semiconductor device is a second Field Effect Transistors (FET) and the replacement structure comprises a channel structure of the second FET and wherein the channel structure of the first FET and the channel structure of the second FET have the same thickness.

20. A method as claimed in claim 1, wherein the growing of the replacement structure is performed by one of: metal organic chemical vapor deposition (MOCVD); atmospheric pressure CVD; low or reduced pressure CVD; ultra-high vacuum CVD; molecular beam epitaxy (MBE); atomic layer deposition (ALD) and hydride vapor phase epitaxy.

21. A method as claimed in claim 20, wherein the seed surface of the substrate has a seed surface area of less than 2500 $nm^2$.

\* \* \* \* \*